US007268007B2

(12) United States Patent
Onishi et al.

(10) Patent No.: US 7,268,007 B2
(45) Date of Patent: Sep. 11, 2007

(54) COMPOUND SEMICONDUCTOR, METHOD FOR MANUFACTURING THE SAME, SEMICONDUCTOR DEVICE, AND METHOD FOR MANUFACTURING THE SAME

(75) Inventors: Toshikazu Onishi, Kyoto (JP); Kenichi Inoue, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 236 days.

(21) Appl. No.: 10/959,077

(22) Filed: Oct. 7, 2004

(65) Prior Publication Data

US 2005/0079646 A1    Apr. 14, 2005

(30) Foreign Application Priority Data

Oct. 10, 2003    (JP)    ............... 2003-352035

(51) Int. Cl.
    *H01L 21/00*    (2006.01)
(52) U.S. Cl. .......................... 438/46; 438/47
(58) Field of Classification Search ................. 438/45, 438/46, 47; 257/14, 13, 94, 96, 102, 103
    See application file for complete search history.

(56) References Cited

U.S. PATENT DOCUMENTS

| 5,814,531 | A    | 9/1998 | Anayama et al. |
| 6,570,179 | B1   | 5/2003 | Razeghi |
| 6,991,955 | B2 * | 1/2006 | Onishi ................ 438/46 |

FOREIGN PATENT DOCUMENTS

| EP | 0 665 618 A1    | 8/1995 |
| JP | 11-112030 A     | 4/1999 |
| JP | 2003-243695 A   | 8/2003 |

OTHER PUBLICATIONS

Ohba, Y., et al., "A Study of p-Type Doping for AlGaInP Grown by Low-Pressure MOCVD." Jpurnal of Crystal Growth, 93, Nov. 1988, XP-002328550, pp. 613-617.
Murata, H., et al. "Low Threshold Current Density of 620nm Band MQW-SCH AlGaInP Semiconductor Lasers with Mg Doped AlInP Cladding Layer." Electronics Letters, Aug. 15, 1991, vol. 27, No. 17, XP000259844, pp. 1569-1571.
Roentgen, P., et al. "MOVPE of AlGaInP/GaInP heterostructures for visible lasers." Journal of Crystal Growth, vol. 1107, No. 1/4, Jan. 1991, XP000246679, pp. 724-730.
European Search Report issued in corresponding European Patent Application No. 04 024 079.8, dated May 18, 2007.

\* cited by examiner

*Primary Examiner*—Kevin M. Picardat
(74) *Attorney, Agent, or Firm*—McDermott Will & Emery LLP

(57) ABSTRACT

A first semiconductor layer consisting of AlGaInP is formed on a substrate consisting of GaAs by crystal growth while adding magnesium (Mg) that is a p-type dopant to the first semiconductor layer. A second semiconductor layer consisting of GaAs is then grown on the first semiconductor layer without adding any magnesium to the second semiconductor layer. Thus, the second semiconductor layer can prevent unintended doping (memory effect) produced by magnesium.

15 Claims, 10 Drawing Sheets

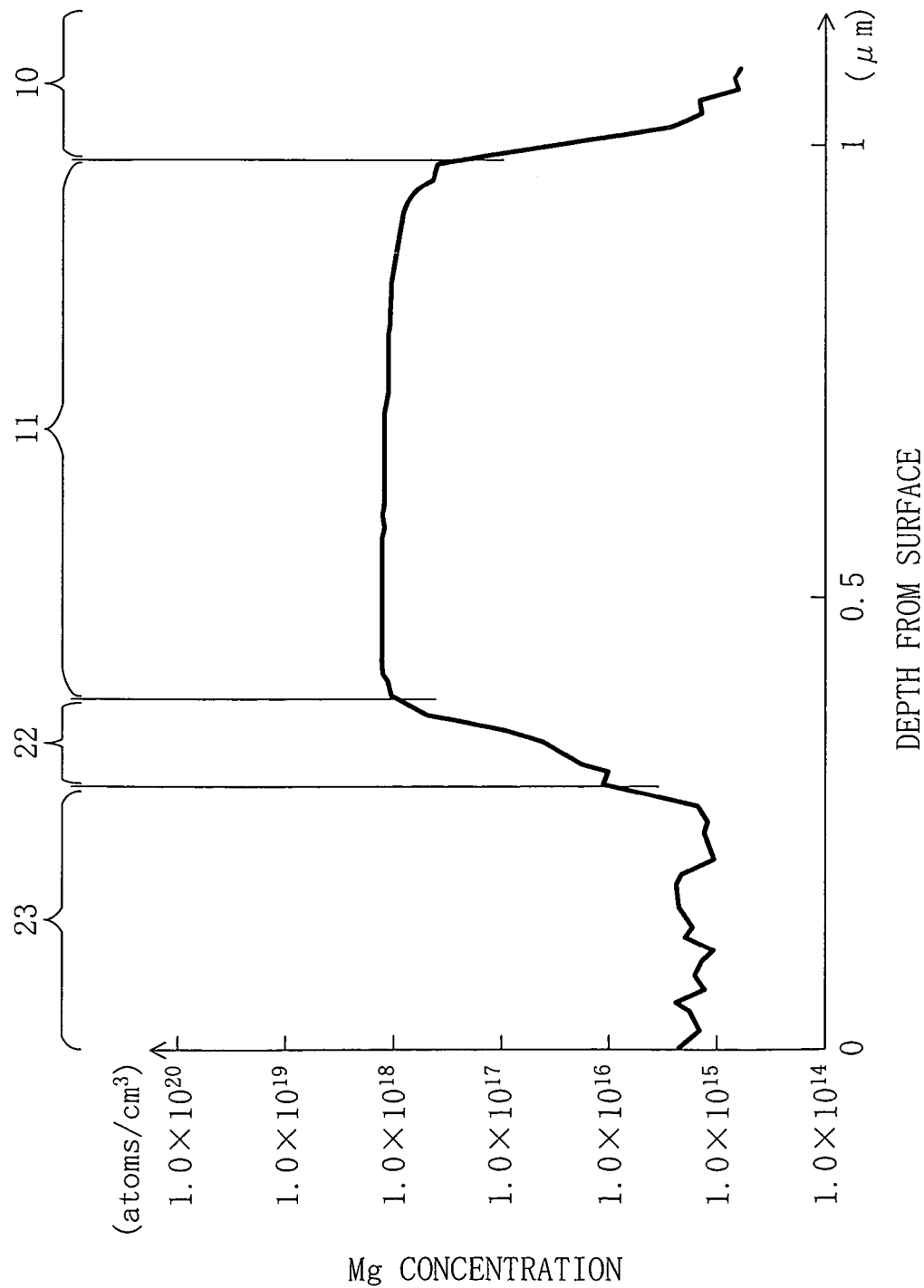

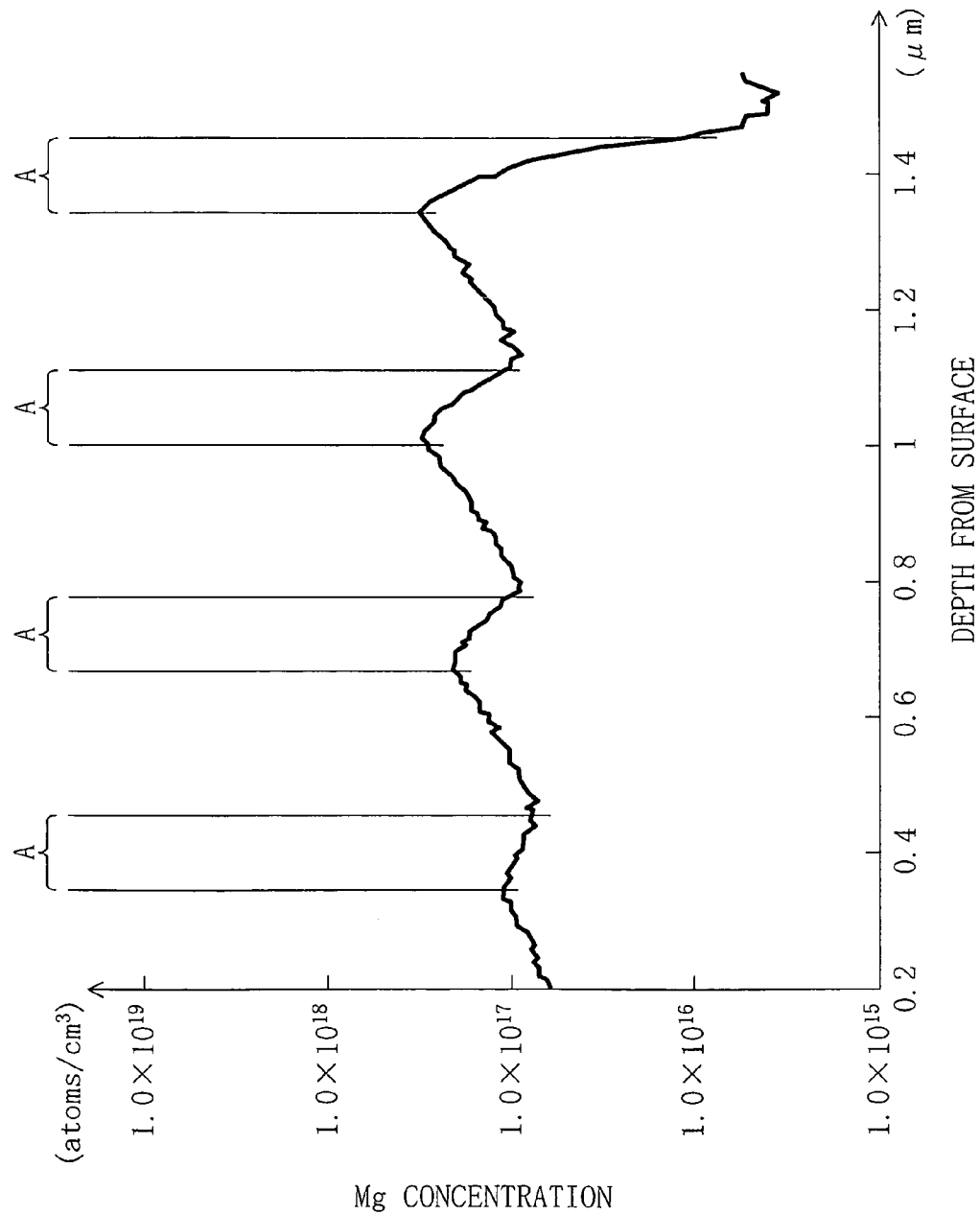

US 7,268,007 B2

COMPOUND SEMICONDUCTOR, METHOD FOR MANUFACTURING THE SAME, SEMICONDUCTOR DEVICE, AND METHOD FOR MANUFACTURING THE SAME

CROSS-REFERENCE

All the matters disclosed in claims, specification, and drawings of Japanese Patent Application No. 2003-352035 filed on Oct. 10, 2003 are incorporated herein as reference.

BACKGROUND OF THE INVENTION

The present invention relates to a compound semiconductor constituted using a AlGaInP-based semiconductor material, a method for manufacturing the same, a semiconductor device, and a method for manufacturing the same.

A digital versatile disk (DVD) apparatus, which can record information with quite a high density, is rapidly spreading in fields of personal computers and audio-video apparatuses. Recently, a DVD apparatus that can write or re-write information in a DVD is in particular expected to further spread as a next-generation video recorder (DVD recorder) to replace, for example, a mass-storage external memory (e.g., a DVD-R or a DVD-RAM) or a videotape recorder. To this end, it is an important challenge to improve a write rate.

In the DVD apparatus that can write or rewrite data to the DVD, a semiconductor laser device that outputs a red light at a wavelength of about 650 nm is employed as a pickup light source for reading or rewriting data. To improve the write rate of the DVD apparatus, therefore, it is necessary to ensure high power output of the semiconductor laser device.

A conventional semiconductor laser device capable of outputting a red light will now be described with reference to the drawings.

FIG. 9 is a block diagram of a sectional configuration of the conventional semiconductor laser device. As shown in FIG. 9, an n-type cladding layer 61 consisting of AlGaInP, an active layer 62 having a quantum well structure in which an AlGaInP layer and a GaInP layer are alternately provided, a first p-type cladding layer 63 consisting of AlGaInP, and an etching stop layer 64 consisting of GaInP are layered on a principal surface of a substrate 60 consisting of n-type GaAs in this order. A second p-type cladding layer 65 consisting of AlGaInP and processed into a ridge shape is formed on the etching stop layer 64. A first contact layer 66 consisting of p-type GaInP is formed on the second p-type cladding layer 65. A first current block layer 67 consisting of n-type AlInP and a second current block layer 68 consisting of n-type GaAs are formed on the etching stop layer 64 so as to bury side regions of the second p-type cladding layer 65 and the first contact layer 66. Further, a second contact layer 69 consisting of p-type GaAs is formed on the first contact layer 66 and the second current block layer 68. The respective semiconductor layers 61 to 69 on the substrate 60 are formed by crystal growth using a metal organic chemical vapor deposition (MOCVD) method or a molecular beam epitaxial (MBE) method.

An ohmic n-side electrode 70 is formed on a surface of the substrate 60 opposite to the surface on which the n-type cladding layer 61 is formed, and an ohmic p-side electrode 71 is also formed on the second contact layer 69.

As p-type dopant for AlGaInP, zinc (Zn) is normally used. However, zinc is high in diffusion coefficient relative to an AlGaInP-based semiconductor material. Due to this, at a crystal growth step or a heat treatment step when manufacturing, for example, a semiconductor laser device, zinc is diffused from the first p-type cladding layer 63 toward a quantum well of the active layer 62. If so, the zinc diffused into the quantum well of the active layer 62 generates a non-radiative recombination center in the active layer 62, thereby resulting in a deterioration in an emission efficiency of the semiconductor laser device. In addition, if the zinc serving as the dopant is diffused into the active layer 62, a crystallinity of the quantum well is degraded, thereby resulting in a deterioration in a reliability of the semiconductor laser device.

Magnesium (Mg) is, by contrast, known as a dopant that exhibits a p-type conductive property in AlGaIn and that is low in diffusion coefficient. However, magnesium strongly adheres to piping and a reaction chamber of a crystal growth apparatus. Due to this, it is known that, after supply of a material is stopped or at the next crystal growth step, unintended magnesium doping occurs, that is, magnesium produces a so-called memory effect.

FIG. 10 shows a result of an experiment conducted by the inventors of the present invention to confirm the memory effect produced by magnesium. In the experiment, when a semiconductor layer consisting of GaAs is grown on a substrate consisting of GaAs by the MOCVD method, four Mg doped-region (region that supplies an Mg raw material) layers A are formed at predetermined intervals during growth of the semiconductor layer. A magnesium concentration profile of the semiconductor layer in which the four Mg doped-region layers are formed is measured by a secondary ion mass spectrometry (SIMS). As can be seen from FIG. 10, even if the supply of the magnesium raw material is stopped during the growth of the GaAs semiconductor layer, the magnesium exhibits a concentration of at least a second half level of $10^{16}$.

To avoid this memory effect, a method in which a reaction chamber for growing a semiconductor layer into which a p-type dopant, for example, is not doped and the other reaction chamber for doping the p-type dopant are separately used is disclosed in Japanese Patent Application Laid-Open No. 11-112030.

The method disclosed therein, however, has a disadvantage of complicated manufacturing facility and manufacturing steps such as a need to prepare a plurality of reaction chambers and a need to move a sample (substrate) among the plural reaction chambers.

Furthermore, the conventional method has the following disadvantages. When the substrate is moved among the plural reaction chambers, it is necessary to interrupt and resume the crystal growth. Due to this, as compared with continuous formation of a multilayer structure, a flatness of an interface between the respective semiconductor layers and a steepness of a composition change on the interface are deteriorated.

SUMMARY OF THE INVENTION

In view of the above-mentioned conventional disadvantages, the present invention has been devised for the purpose of preventing the memory effect produced when magnesium (Mg) is used as a p-type dopant for a III-V group compound semiconductor, and ensuring that p-type doping can be performed with excellent controllability.

As a result of various considerations to a cause for the memory effect, the inventors of the present invention acquired a first knowledge that the memory effect extremely differs in degree, depending on a composition of a compound semiconductor doped with Mg. Namely, if a compound semiconductor consisting of V group element and containing arsenic (As) is to be doped with Mg, a high memory effect is produced. If a semiconductor compound consisting of V group element and containing phosphorus (P) is to be doped with Mg, the memory effect is greatly reduced. The reason is considered as follows. If the compound semiconductor consisting of the V group element and containing As is doped with Mg, the Mg tends to remain in the reaction chamber due to low doping efficiency. If the compound semiconductor consisting of the V group element and containing P is doped with Mg, the doping efficiency is high and Mg tends to be introduced into crystals. Therefore, the Mg remaining in the reaction chamber is reduced. In other words, a cohesive strength for coupling the Mg serving as the dopant with P is higher than that for coupling the Mg with the As.

Furthermore, the inventors of the present invention acquired a second knowledge that if the compound semiconductor consisting of the V group element and containing phosphorus is grown after stopping the supply of the magnesium, the Mg concentration profile is steeper in a growth direction. Namely, when the compound semiconductor layer consisting of the V group element and containing phosphorus is grown undoped, the Mg concentration is rapidly reduced in the undoped compound semiconductor layer even if an underlying layer below the compound semiconductor layer to be grown is doped with magnesium and the compound semiconductor layer is grown. The reason is considered as follows. A reaction byproduct is bonded with the magnesium in a certain manner at a step of growing the undoped compound semiconductor layer, and the bonded byproduct and magnesium are transformed to a component that does not contribute to the growth of the compound semiconductor layer.

Specifically, a method for manufacturing a first compound semiconductor according to the present invention is based on the first knowledge, and characterized by comprising: a step (a) of forming a first compound semiconductor layer containing phosphorus while adding magnesium to the first compound semiconductor layer; and a step (b) of forming a second compound semiconductor layer on the first compound semiconductor layer without adding the magnesium to the second compound semiconductor.

According to the method for manufacturing the first compound semiconductor, and based on the first knowledge, the magnesium doping efficiency is improved in the first compound semiconductor layer containing phosphorus, and the magnesium-producing memory effect can be prevented from being exerted on the second compound semiconductor layer. Therefore, magnesium doping which is unnecessary for the second compound semiconductor layer does not occur.

It is preferable that in the method for manufacturing the first compound semiconductor, the second compound semiconductor layer contains arsenic or nitrogen.

A first compound semiconductor according to the present invention is based on the first knowledge, and characterized by comprising: a first compound semiconductor layer which is formed on a substrate, to which magnesium is added as a dopant, and which contains phosphorus in its composition; and a second compound semiconductor layer which is formed on the first compound semiconductor layer, and to which the magnesium is not added as the dopant.

According to the first compound semiconductor of the present invention, the second compound semiconductor layer to which magnesium is not added as the dopant is formed on the first compound semiconductor layer to which magnesium is added and which contains phosphorus in its composition. Due to this, the memory effect produced by magnesium serving as the dopant for the first compound semiconductor layer is not exerted on the second compound semiconductor layer. The magnesium concentration profile on an interface between the first compound semiconductor and the second compound semiconductor is steep.

It is preferable that in the first compound semiconductor of the present invention, the second compound semiconductor layer contains arsenic or nitrogen in its composition.

A method for manufacturing a second compound semiconductor according to the present invention is based on the second knowledge, and characterized by comprising: a step (a) of forming a first compound semiconductor layer while adding magnesium to the first compound semiconductor layer; and a step (b) of forming a second compound semiconductor layer containing phosphorus on the first compound semiconductor layer without adding the magnesium to the second compound semiconductor.

According to the method for manufacturing the second compound semiconductor, and based on the second knowledge, the magnesium-producing memory effect can be prevented from being exerted on the second compound semiconductor layer containing phosphorus. Therefore, magnesium doping which is unnecessary for the second compound semiconductor layer does not occur.

It is preferable that in the method for manufacturing the second compound semiconductor, the first compound semiconductor layer contains phosphorus. If so, it is possible to ensure doping magnesium that is the p-type dopant into the first compound semiconductor layer containing phosphorus.

It is preferable that the method for manufacturing the second compound semiconductor further comprises, after the step (b), a step (c) of forming a third compound semiconductor layer containing arsenic or nitrogen on the second compound semiconductor layer. If so, the magnesium-producing memory effect can be further suppressed from being exerted on the third compound semiconductor layer formed on the second compound semiconductor layer and containing arsenic or nitrogen.

It is preferable that in the method for manufacturing the second compound semiconductor, the first compound semiconductor layer contains arsenic or nitrogen, and that the method further comprises, after the step (b), a step (c) of removing the second compound semiconductor layer. Since the second compound semiconductor layer containing phosphorus is removed, the compound semiconductor doped with magnesium and containing arsenic or nitrogen can be obtained while preventing the memory effect produced when magnesium is added.

It is preferable that in the method for manufacturing the second compound semiconductor, at the step (b), the second compound semiconductor layer is formed while adding zinc to the second compound semiconductor layer. If so, the conductive type of the second compound semiconductor layer can be made a p type. Therefore, the first compound semiconductor layer and the second compound semiconductor layer can be both set to have the p conductive type. If the first compound semiconductor layer and the second compound semiconductor layer are equal in material composition, in particular, the entire compound semiconductor can be easily set to have the p conductive type by adding zinc (Zn) to the second compound semiconductor layer although the second compound semiconductor layer cannot be selectively removed. Besides, the dopant for the first compound semiconductor layer is magnesium having a low diffusion coefficient, and the first compound semiconductor layer is formed between the second compound semiconductor layer to which zinc having a high diffusion coefficient and the substrate. Therefore, it is possible to prevent the diffusion of zinc from the second compound semiconductor layer toward the substrate.

It is preferable that in the method for manufacturing the second compound semiconductor, a thickness of the second compound semiconductor layer is equal to or larger than 0.1 µm. If so, it is possible to ensure preventing the magnesium-producing memory effect.

A second compound semiconductor according to the present invention is based on the second knowledge, and is characterized by comprising: a first compound semiconductor layer which is formed on a substrate, and to which magnesium is added as a dopant; and a second compound semiconductor layer which is formed on the first compound semiconductor layer, and which contains phosphorus in its composition.

According to the second compound semiconductor of the present invention, the memory effect produced by magnesium serving as the dopant is not exerted on the second compound semiconductor layer formed on the first compound semiconductor layer and containing phosphorus in its composition. Therefore, a magnesium concentration profile on an interface between the first compound semiconductor and the second compound semiconductor is steep.

It is preferable that in the second compound semiconductor layer of the present invention, the first compound semiconductor layer contains phosphorus in its composition.

A method for manufacturing a semiconductor device according to the present invention is based on the second knowledge, and is characterized by comprising: a step (a) of forming an n-type cladding layer serving as a first compound semiconductor layer on a substrate; a step (b) of forming an active layer serving as a second compound semiconductor layer on the n-type cladding layer; a step (c) of forming a third compound semiconductor layer on the active layer while adding magnesium to the third compound semiconductor layer; and a step (d) of forming a fourth compound semiconductor layer containing phosphorus on the third compound semiconductor layer without adding the magnesium to the fourth compound semiconductor layer.

According to the method for manufacturing a semiconductor device of the present invention, since the dopant added to the third compound semiconductor layer formed on the active layer is magnesium having a low diffusion coefficient, the diffusion of impurities from the p-type third compound semiconductor layer into the active layer is suppressed. Therefore, the semiconductor device having a good emission efficiency and a high reliability can be obtained. In addition, at the step of forming the fourth compound semiconductor layer containing phosphorus on the third compound semiconductor layer, no magnesium is added. Therefore, the magnesium-producing memory effect is not exerted on the fourth compound semiconductor layer, and it is possible to make it difficult to capture magnesium in the fourth compound semiconductor layer, accordingly.

It is preferable that in the method for manufacturing the semiconductor device of the present invention, at the step (d), the fourth compound semiconductor layer is formed while adding zinc to the fourth compound semiconductor layer. If so, the conductive type of the fourth compound semiconductor layer can be made a p conductive type. Therefore, the semiconductor device can be obtained without removing the fourth compound semiconductor layer.

It is preferable that in the method for manufacturing the semiconductor device of the present invention, each of the third compound semiconductor layer and the fourth compound semiconductor layer consists of AlGaInP if zinc is added to the fourth compound semiconductor layer, and that the method further comprises, between the step (c) and the step (d), a step (e) of growing a fifth compound semiconductor layer consisting of GaInP on the third compound semiconductor layer.

If so, it is possible to prevent the diffusion of zinc from the fourth compound semiconductor layer toward the substrate due to a composition difference among mixed crystals on an interface between the third compound semiconductor layer and the fifth compound semiconductor layer or between the fourth compound semiconductor layer and the fifth compound semiconductor layer.

In this case, it is preferable that a thickness of the fifth compound semiconductor layer is equal to or smaller than 15 nm, and that the method for manufacturing the semiconductor device according to the present invention further comprises, after the step (d), a step (f) of forming the fourth compound semiconductor layer into a ridge shape.

If so, by processing the fourth compound semiconductor layer into the ridge shape using the fifth compound semiconductor layer as an etching stop layer, a ridge waveguide type semiconductor laser device can be obtained.

It is preferable that, in the method for manufacturing the semiconductor device according to the present invention, a thickness of the fourth compound semiconductor layer is equal to or larger than 0.1 µm. If so, even if zinc having a relatively high diffusion coefficient is used as a dopant doped into the layers above the fourth compound semiconductor layer, the diffusion of zinc toward the substrate can be prevented.

A first semiconductor device according to the present invention is characterized by comprising: a first compound semiconductor layer which is formed on a substrate, to which magnesium is added as a dopant, and which contains phosphorus in its composition; and a second compound semiconductor layer which is formed on the first compound semiconductor layer, and to which the magnesium is not added as the dopant.

A second semiconductor device according to the present invention is characterized by comprising: a first compound semiconductor layer which is formed on a substrate, and to which magnesium is added as a dopant; and a second compound semiconductor layer which is formed on the first compound semiconductor layer, and which contains phosphorus in its composition.

A third semiconductor device according to the present invention is characterized by comprising: an n-type cladding layer which is formed on a substrate, and which serves as a first compound semiconductor layer; an active layer which is formed on the n-type cladding layer, and which serves as a second compound semiconductor layer; a third compound semiconductor layer which is formed on the active layer, and to which magnesium is added to the third compound semiconductor layer as a dopant; and a fourth compound semiconductor layer which is formed on the third compound semiconductor layer, and which contain phosphorus in its composition.

It is preferable that in the third semiconductor device according to the present invention, zinc is added, as the dopant, to the fourth compound semiconductor layer.

It is preferable that the third semiconductor device according to the present invention further comprises a fifth compound semiconductor layer which is formed between the third compound semiconductor layer and the fourth compound semiconductor layer, which has a thickness equal to or smaller than 15 nm, and which consists of GaInP, and that the fourth compound semiconductor layer consists of AlGaInP and has a ridge shape.

A fourth semiconductor device according to the present invention is characterized by comprising: an n-type collector layer which is formed on a substrate, and which serves as a first compound semiconductor layer; a p-type base layer which is formed on the n-type collector layer, to which magnesium is added as a dopant, which contains phosphorus in its composition, and which serves as a second compound semiconductor layer; and an n-type emitter layer which is formed on the p-type base layer, to which the magnesium is not added as the dopant, and which serves as a third compound semiconductor layer.

BRIEF DESCRIPTION OF THE DRAWINGS

FIG. 4 is a graph showing an Mg concentration profile of the compound semiconductor in the first modification of the first embodiment of the present invention.

FIG. 10 is a graph of an Mg concentration profile of a conventional compound semiconductor.

DETAILED DESCRIPTION OF THE INVENTION

Figure 1:
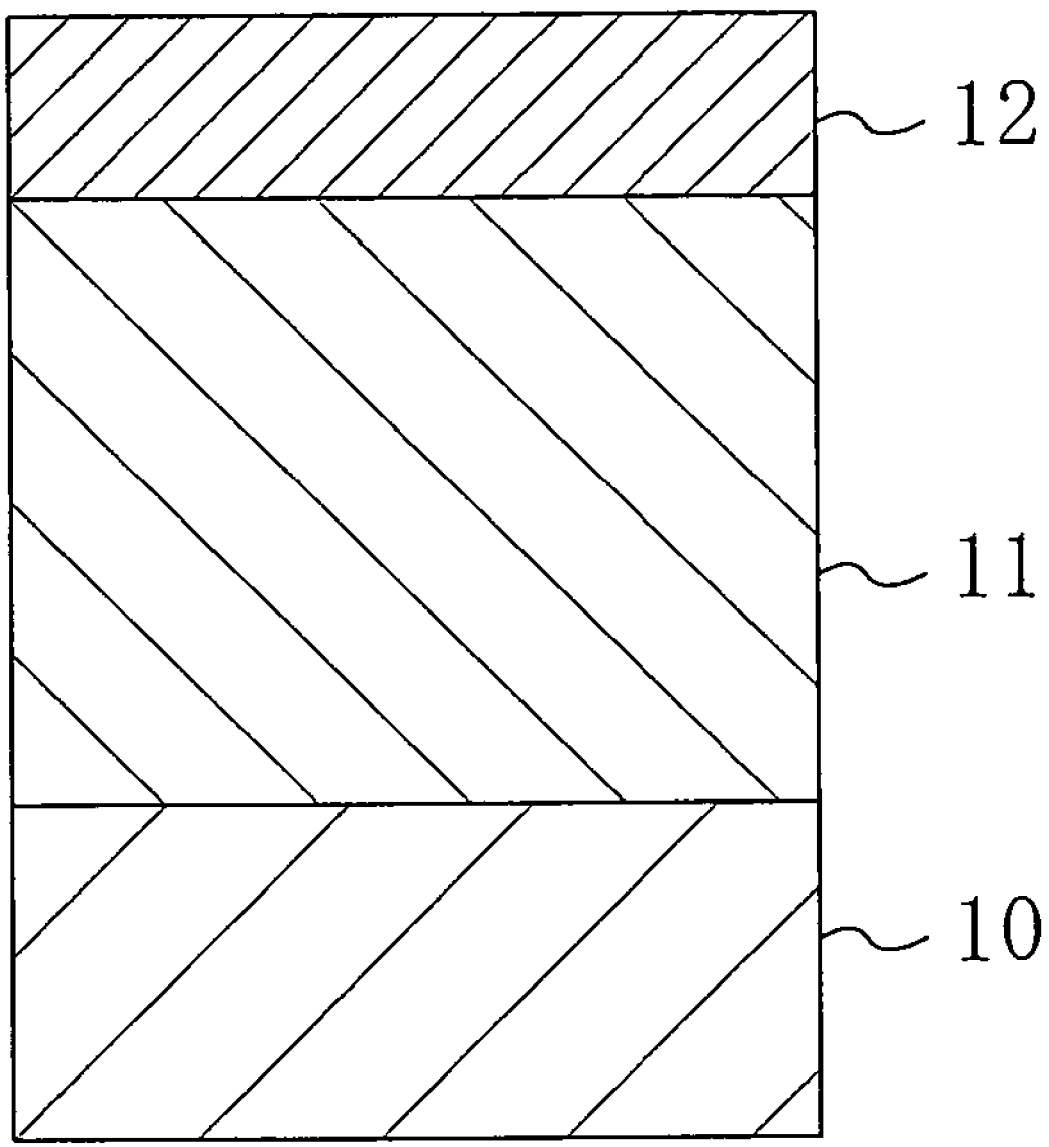
FIG. 1 is a sectional block diagram of a compound semiconductor in a first embodiment of the present invention.

Hereinafter, preferred embodiments of the present invention will be described with reference to the accompanying drawings, in which the same reference numerals denote the same components, respectively.

EMBODIMENT 1

A first embodiment of the present invention will be described with reference to the drawings.

In the specification of the present application, AlGaInP signifies a compound that contains at least one of aluminum (Al), gallium (Ga), and indium (In) in a III group element, and contains phosphorus (P) in a V group element, and that is expressed by a general formula of $Al_xGa_yIn_{1-x-y}P$ (where x and y satisfy $0 \leq x \leq 1$, $0 \leq y \leq 1$, and $0 \leq x+y \leq 1$). In addition, AlGaAs signifies a compound that contains at least one of aluminum (Al) and gallium (Ga) in a III group element, and contains arsenic (As) in a V group element, and that is expressed by a general formula of $Al_zGa_{1-z}As$ (where z satisfies $0 \leq z \leq 1$).

FIG. 1 shows a sectional configuration of a compound semiconductor (e.g., an epitaxial substrate) in the first embodiment of the present invention. As shown in FIG. 1, the compound semiconductor in the first embodiment is constituted so that a first semiconductor layer 11 that consists of, for example, $Al_{0.35}Ga_{0.15}In_{0.5}P$ and that has a thickness of about 0.6 µm, and a second semiconductor layer 12 that consists of, for example, gallium arsenide (GaAs) and that has a thickness of about 0.3 µm are formed on a substrate 10 consisting of GaAs by epitaxial growth in this order.

The first semiconductor layer 11 and the second semiconductor layer 12 are formed by, for example, the MOCVD method. Out of the respective semiconductor layers 11 and 12, the first semiconductor layer 11 is grown while being doped with magnesium (Mg) serving as a p-type dopant so that an Mg concentration is $1 \times 10^{18}$ cm$^{-13}$.

It is noted that the second semiconductor layer 12 functions to protect the first semiconductor layer 11 consisting of $Al_{0.35}Ga_{0.15}In_{0.5}P$ that is easily oxidized in the atmosphere.

A result of measuring the Mg concentration in the second semiconductor layer 12 will be shown and a state in which the Mg-caused memory effect is prevented will be described.

Figure 2:
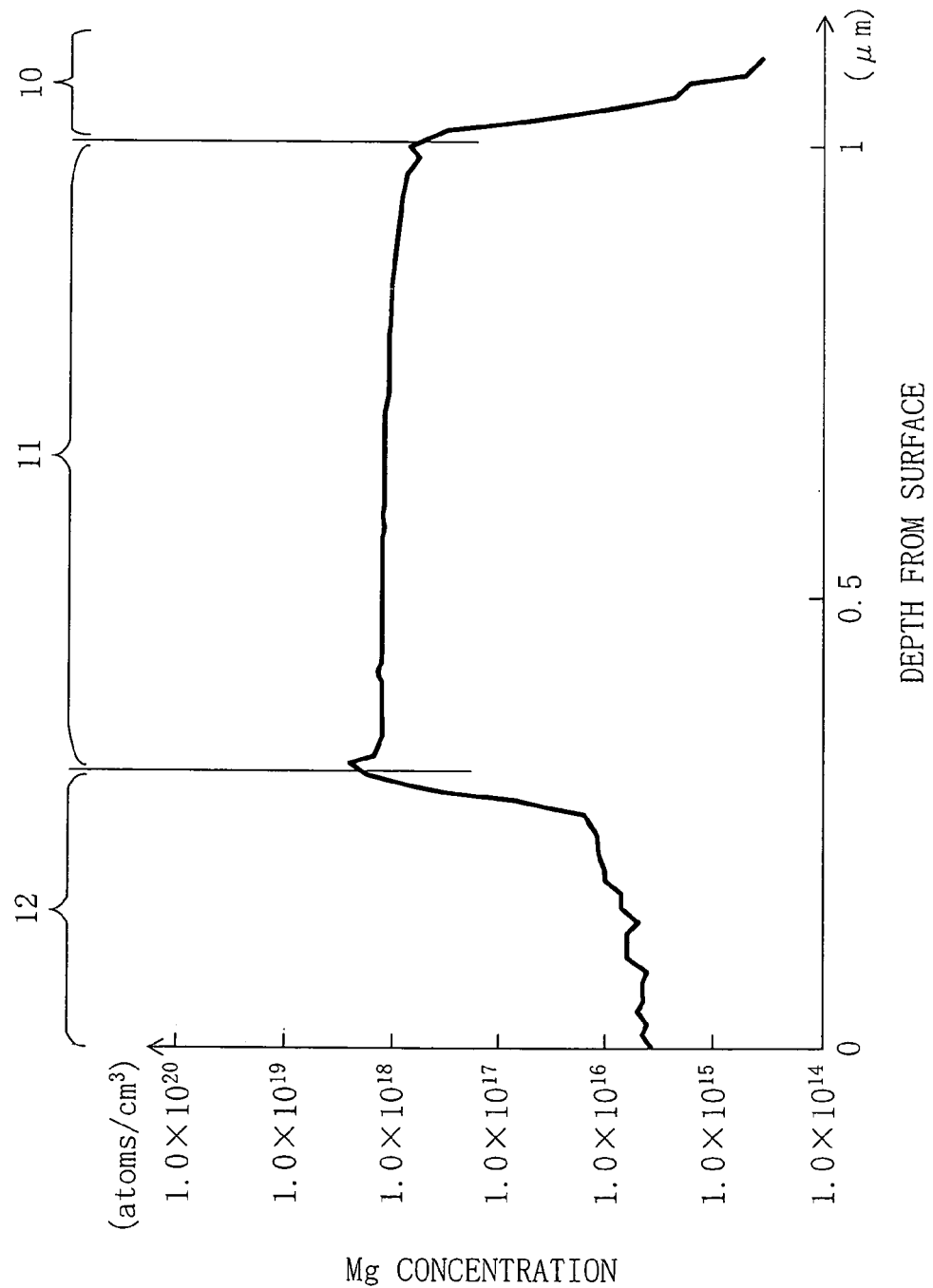
FIG. 2 is a graph showing an Mg concentration profile of the compound semiconductor in the first embodiment of the present invention.

FIG. 2 is a graph which depicts the result of measuring the Mg concentration profile of the compound semiconductor shown in FIG. 1 by the SIMS. As can be understood from FIG. 2, the Mg concentration has a change such that the concentration rapidly lowers in the second semiconductor layer 12. After Mg doping is finished and after the second semiconductor layer 12 is grown by 0.1 µm, the Mg concentration is reduced to $1 \times 10^{16}$ cm$^{-3}$, in which case the Mg concentration change reaches a two-digit level. As for the conventional Mg doping shown in FIG. 10, by contrast, after the Mg doping is finished and after the semiconductor layer is grown by 0.1 µm, the Mg concentration change is about half the change shown in FIG. 2 at most and an Mg concentration decrease is less than one figure level.

This indicates that if the semiconductor layer consisting of the phosphorus-containing compound semiconductor is doped with magnesium (Mg) serving as the p-type dopant, the Mg memory effect is considerably reduced at a semiconductor layer formation step of forming another semiconductor layers on the second semiconductor layer 12.

Modification 1 of Embodiment 1

A compound semiconductor in a first modification of the first embodiment of the present invention will be described with reference to FIG. 3.

Figure 3:
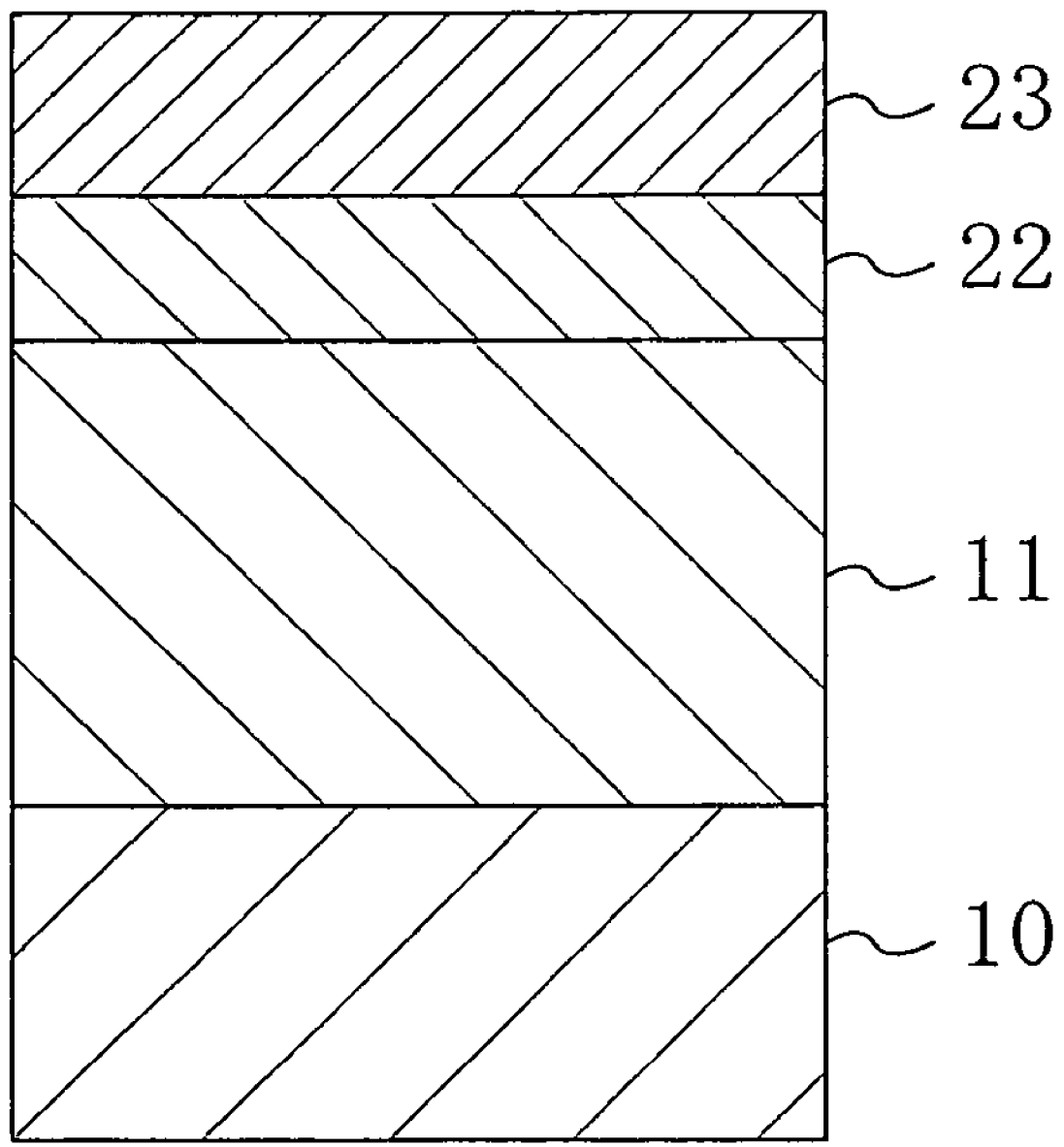
FIG. 3 is a sectional block diagram of a compound semiconductor in a first modification of the first embodiment of the present invention.

FIG. 3 is a sectional block diagram of the compound semiconductor in the first modification of the first embodiment of the present invention. As shown in FIG. 3, a first semiconductor layer 11 that consists of $Al_{0.35}Ga_{0.15}In_{0.5}P$ and that has a thickness of about 0.5 µm, a second semiconductor layer 22 that consists of $Al_{0.35}Ga_{0.15}In_{0.5}P$ and that has a thickness of about 0.1 µm, and a third semiconductor layer 23 that consists of GaAs and that has a thickness of about 0.3 µm are formed on a substrate 10 consisting of GaAs by epitaxial growth in this order.

FIG. 4 is a graph that depicts a result of measuring an Mg concentration profile of the compound semiconductor in the first modification of the first embodiment of the present invention by the SIMS. As can be understood from FIG. 4, the Mg concentration of the third semiconductor layer 23 is $1 \times 10^{15}$ cm$^{-3}$ to $2 \times 10^{15}$ cm$^{-3}$, and is a low value corresponding to a background almost over the entire third semiconductor layer 23.

The Mg concentration at a position of 0.2 μm from a position at which the supply of the Mg is finished (at which growth of the second semiconductor layer 22 starts) in the first modification is compared with that in the first embodiment. In the first embodiment shown in FIG. 2, the Mg concentration at that position is $7 \times 10^{15}$ cm$^{-3}$. In the first modification, the Mg concentration at that position is $2 \times 10^{15}$ cm$^{-3}$ corresponding to the background value as shown in FIG. 4.

The comparison indicates that by growing the second semiconductor layer 22 that contains phosphorus but that is not doped with magnesium after the first semiconductor layer 11 doped with the Mg is grown, the Mg-producing memory effect is further suppressed in the third semiconductor layer 23.

Preferably, the second semiconductor layer 22 in the compound semiconductor according to the present invention is doped with zinc (Zn) serving as a p-type dopant. If so, a conductive type of the second semiconductor layer 22 is also p type, so that the first semiconductor layer 11 and the second semiconductor layer 22 can be both set to have the p conductive type. Namely, to avoid the memory effect in the compound semiconductor to which magnesium (Mg) is added, by compensating for the Mg concentration which needs to be reduced on a surface of the second semiconductor layer 22 by adding zinc (Zn), the entire first semiconductor layer 11 and second semiconductor layer 22 can be equally maintained to have the p conductive type.

In this case, the dopant for the first semiconductor layer 11 is magnesium having a low diffusion coefficient, and the first semiconductor layer 11 is formed between the second semiconductor layer 22 doped with zinc (Zn) having a high diffusion coefficient and the substrate 10. Due to this, as compared with an instance in which zinc (Zn) is used as the p-type dopant for both the first semiconductor layer 11 and the second semiconductor layer 22, the p-type compound semiconductor layer can be manufactured while suppressing diffusion of the zinc from the p-type semiconductor layers 11 and 22 toward the substrate 10, respectively.

Furthermore, it is preferable that the thickness of the second semiconductor layer 22 in the compound semiconductor according to the present invention is equal to or larger than 0.1 μm. If so, as shown in FIG. 4, it is possible to ensure reducing the Mg concentration of the third semiconductor layer 23 formed next to the second semiconductor layer 22.

In this first modification, the instance of adding the zinc (Zn) to the second semiconductor layer 22 has been described. However, the present invention is not limited to this. It suffices that any dopant which enables the second semiconductor layer 22 to have the p conductive type is used. For example, even if carbon (C), for example, is added to the second semiconductor layer 22 as the dopant, the same advantage can be obtained.

Modification 2 of Embodiment 1

A second modification of the first embodiment of the present invention will be described with reference to FIGS. 5A and 5B.

Figure 5A:
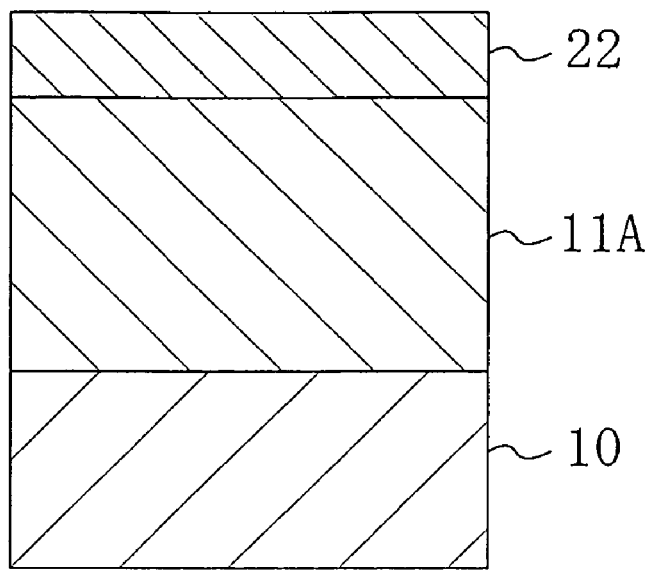
FIG. 5 is a sectional block diagram which shows a method for manufacturing a compound semiconductor in a second modification of the first embodiment of the present invention in an order of steps.

First, as shown in FIG. 5A, a first semiconductor layer 11A that consists of Al$_{0.5}$Ga$_{0.5}$As and that has a thickness of about 1 μm and a second semiconductor layer 22 that consists of Al$_{0.35}$Ga$_{0.15}$In$_{0.5}$P and that has a thickness of about 0.2 μm are formed on a substrate 10 consisting of GaAs by the MOCVD method in this order.

In this second modification, when the first semiconductor layer 11A is to be grown, the layer 11A is grown while adding Mg serving as a p-type dopant thereto so that an Mg concentration is $1 \times 10^{18}$ cm$^{-3}$.

Figure 5B:
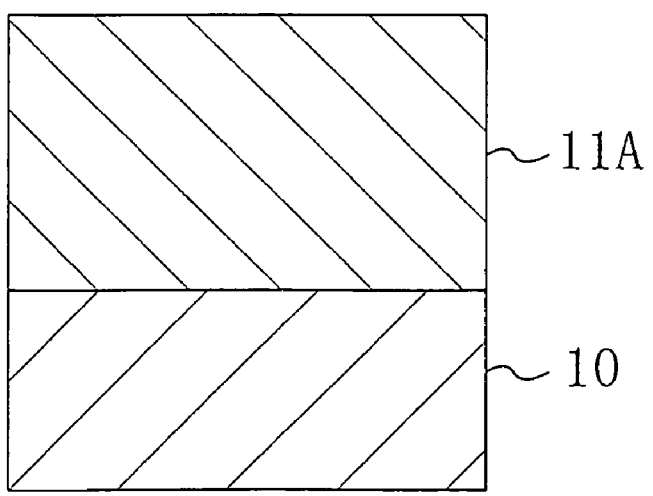

Next, as shown in FIG. 5B, the second semiconductor layer 22 is removed, for example, by wet etching using an etchant that mainly contains hydrochloric acid (HCl).

As a result, a compound semiconductor that consists of Al$_{0.5}$Ga$_{0.5}$As doped with Mg, that is, a compound semiconductor that does not contain phosphorus (P) can be obtained while suppressing the memory effect produced when the magnesium (Mg) is added to the second semiconductor layer 22.

In the second modification, a composition of the first semiconductor layer 11A is Al$_{0.5}$Ga$_{0.5}$As. However, the present invention is not limited to this. Even if AlGaInN that is a III-V group nitride semiconductor using nitrogen as the V group element is employed as the first semiconductor layer 11A, the compound semiconductor that consists of Mg-doped AlGaInN can be obtained while suppressing the memory effect.

EMBODIMENT 2

A second embodiment of the present invention will be described with reference to the drawings.

Figure 6:
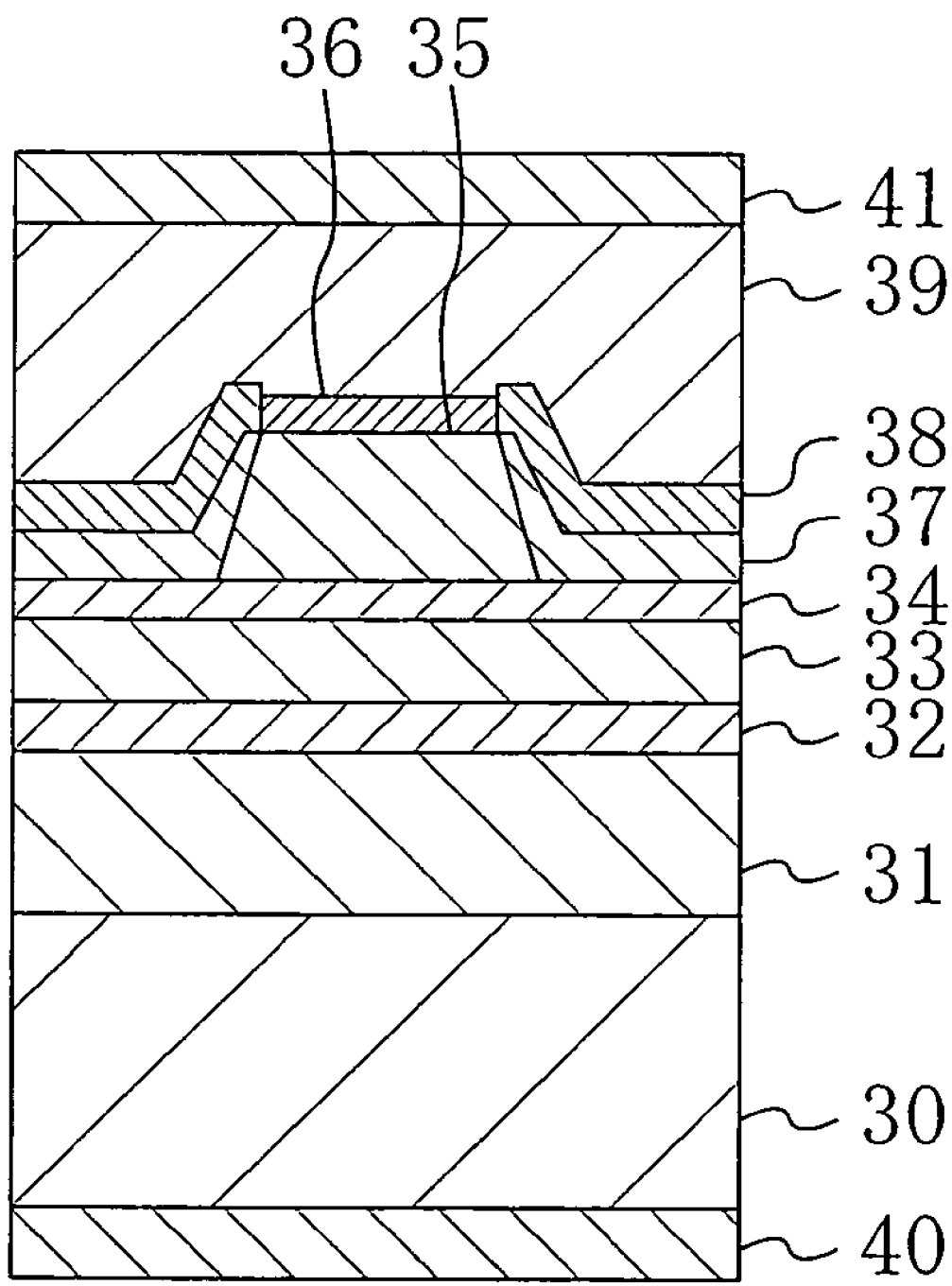
FIG. 6 is a sectional block diagram of a semiconductor laser device in a second embodiment of the present invention.

FIG. 6 is a sectional block diagram of a semiconductor layer in the second embodiment of the present invention. As shown in FIG. 6, an n-type cladding layer 31 that consists of n-type Al$_{0.35}$Ga$_{0.15}$In$_{0.5}$P and that has a thickness of about 2 μm, an active layer 32 that consists of undoped AlGaInP and that has a multiple quantum well structure, a first p-type cladding layer 33 that consists of p-type Al$_{0.35}$Ga$_{0.15}$In$_{0.5}$P and that has a thickness of about 0.2 μm, and an etching stop layer 34 that consists of p-type Ga$_{0.15}$In$_{0.5}$P and that has a thickness of about 10 nm are formed on an n-type substrate 30 that consists of GaAs and that has a thickness of about 100 μm by crystal growth in this order.

A second p-type cladding layer 35 that consists of p-type Al$_{0.35}$Ga$_{0.15}$In$_{0.5}$P and that has a thickness of about 1 μm is formed into a ridge shape in a central portion of an upper surface of the etching stop layer 34. A first contact layer 36 that consists of p-type Ga$_{0.5}$In$_{0.5}$P and that has a thickness of about 50 nm is formed on the ridge-shaped second p-type cladding layer 35.

A first current block layer 37 that consists of n-type Al$_{0.5}$In$_{0.5}$P and that has a thickness of about 0.3 μm and a second current block layer 38 that consists of n-type GaAs and that has a thickness of about 0.3 μm are layered on the upper surface of the etching stop layer 34 and side surfaces of the second p-type cladding layer 35 and the first contact layer 36 in this order.

A second contact layer 39 that consists of p-type GaAs and that has a thickness of about 3 μm is formed on the first contact layer 36 and the second current block layer 38.

An n-side electrode 40 that consists of a metallic material which is an alloy containing, for example, gold (Au), germanium (Ge), and nickel (Ni) and which ohmic-contacts with an n-type substrate 20 is formed on a surface of the n-type substrate 30 opposite to the surface on which the n-type cladding layer 31 is formed. In addition, a p-side electrode 41 that consists of a metallic material which is an alloy containing chromium (Cr), platinum (Pt), and gold (G) and which ohmic-contacts with the second contact layer 39 is formed on the second contact layer 39.

The active layer 32 is composed of, for example, a multiple quantum well layer in which a well layer that consists of $Ga_{0.5}In_{0.5}P$ and a thickness of about 6 nm and a barrier layer that consists of $Al_{0.25}Ga_{0.25}In_{0.5}P$ and that has a thickness of about 5 nm are alternately layered, and optical guide layers which vertically put the multiple quantum well layer therebetween, each of which consists of $Al_{0.25}Ga_{0.25}In_{0.5}P$ and each of which has a thickness of about 30 nm.

The n-type cladding layer 31, the first p-type cladding layer 33, and the second p-type cladding layer 35 are constituted by a semiconductor material wider in band gap (energy gap) than each of the semiconductor layers that constitute the active layer 32. Due to this, carriers are constrained in the active layer 32. As well known, the band gap of the AlGaInP-based semiconductor material can be widened by relatively increasing an Al composition. While compound semiconductors having same compositions are used for the first p-type cladding layer 33 and the second p-type cladding layer 35, a composition ratio of Al to Ga may be adjusted so that the band gap of the semiconductor material is wider than that of the semiconductor material of each semiconductor layer that constitutes the active layer 32.

The semiconductor laser device in the second embodiment has a so-called ridge stripe waveguide structure in which portions of the n-type cladding layer 31, the active layer 32, the first p-type cladding layer 33, and the etching stop layer 34 which portions are below the second p-type cladding layer 35, and the second p-type cladding layer 35 form a waveguide by forming the second p-type cladding layer 35 into a ridge shape.

Further, if $Al_{0.5}In_{0.5}P$ is used as the semiconductor material for the first current block layer 37, an effective index waveguide is formed.

The etching stop layer 34 is constituted by a semiconductor material having a high etching selectivity to the second p-type cladding layer 35, i.e., having a small Al composition so as not to etch the first p-type cladding layer 33 when the second p-type cladding layer 35 is formed into the ridge shape. In this embodiment, p-type $Ga_{0.5}In_{0.5}P$ having a zero Al composition is used as the semiconductor material for the etching stop layer 34.

GaAs is used for the second contact layer 39 so as to facilitate ohmic contact with a metallic material. In addition, a composition of the first contact layer 36 is adjusted so as to relax band discontinuity between the second p-type cladding layer 35 and the second contact layer 39.

Table 1 shows specific dopant types and doping concentrations for the respective semiconductor layers of the semiconductor laser device in the second embodiment.

TABLE 1

| Semiconductor layer | Thickness | Compound composition | Dopant | Doping concentration (cm$^{-3}$) |
|---|---|---|---|---|
| Second contact layer (39) | 3 μm | GaAs | Zn | $3 \times 10^{18}$ |
| Second current block layer (38) | 0.3 μm | GaAs | Si | $1 \times 10^{18}$ |
| First current block layer (37) | 0.3 μm | $Al_{0.5}In_{0.5}P$ | Si | $1 \times 10^{18}$ |
| First contact layer (36) | 50 nm | $Ga_{0.5}In_{0.5}P$ | Zn | $1 \times 10^{18}$ |
| Second p-type cladding layer (35) | 0.1 μm | $Al_{0.35}Ga_{0.15}In_{0.5}P$ | Mg | $1 \times 10^{18}$ |
| Etching stop layer (34) | 10 nm | $Ga_{0.5}In_{0.5}P$ | Mg | $1 \times 10^{18}$ |
| First p-type cladding layer (33) | 0.2 μm | $Al_{0.35}Ga_{0.15}In_{0.5}P$ | Mg | $1 \times 10^{18}$ |
| Active layer (32) Quantum well layer | | | | |
| Well layer | 6 nm for each layer | $Ga_{0.5}In_{0.5}P$ | — | |
| Barrier layer | 5 nm for each layer | $Al_{0.25}Ga_{0.25}In_{0.5}P$ | — | |
| Optical guide layer | 30 nm for each layer | $Al_{0.25}Ga_{0.25}In_{0.5}P$ | — | |
| n-type cladding layer (31) | 2 μm | $Al_{0.35}Ga_{0.15}In_{0.5}P$ | Si | $1 \times 10^{18}$ |
| n-type substrate (30) | 100 μm | GaAs | Si | $1 \times 10^{18}$ |

As shown in the Table 1, in the semiconductor laser device in the second embodiment, as the dopant for the p-type semiconductor layers, magnesium (Mg) is added to the first p-type cladding layer 33, the etching stop layer 34, and the second p-type cladding layer 35 during growth, and zinc (Zn) is added to the first contact layer 36 and the second contact layer 39 during growth. In the example of the Table 1, doping concentrations of the first p-type cladding layer 33 and the second p-type cladding layer 35 are both about $1 \times 10^{18}$ cm$^{-3}$. Further, silicon (Si) having a concentration of about $1 \times 10^{18}$ cm$^{-3}$ is used as the n-type dopant.

Meanwhile, zinc (Zn) is used as the p-type dopant for the second contact layer 39. The reason is as follows. If magnesium (Mg) is used as the p-type dopant for the AlGaAs-based semiconductor that does not contain phosphorus (P) in the V group element, no Mg is added to the AlGaAs-based semiconductor even when the supply of an Mg material is started, that is, so-called doping delay occurs and a desired doping concentration of the second contact layer 39 cannot be obtained. It is noted that even if Mg is used as the p-type dopant for the AlGaInP-based semiconductor, no doping delay occurs and the desired doping concentration can be obtained. These are based on the knowledges of the inventors of the present invention.

In the semiconductor laser device in the second embodiment, by applying a predetermined voltage between the n-side electrode 40 and the p-side electrode 41, holes injected from the p-side electrode 41 are confined by a pn junction between the n-type first current block layer 37 and n-type second current block layer 38 and the second p-type cladding layer 35, and the holes reach the active layer 32 through the etching stop layer 34 and the first p-type cladding layer 33. Accordingly, the holes are injected into the portion of the active layer 32 below the second p-type cladding layer 35 with a high density, a radiative recombination occurs between the injected holes and electrons injected from the n-side electrode 40, so that a laser light at a wavelength of about 650 nm, corresponding to a band gap of the quantum layer, is oscillated.

The second embodiment is characterized by growing the first contact layer 36 consisting of $Ga_{0.5}In_{0.5}P$ without adding no Mg after the growth of the first p-type cladding layer 33, the etching stop layer 34, and the second p-type cladding layer 35 performed while adding Mg thereto.

Namely, as already described with reference to FIG. 4, the Mg concentration of the first contact layer 36 that consists of GaInP can be rapidly reduced. Therefore, it is possible to suppress unintended capture of Mg into the semiconductor layers such as the first current block layer 37 formed after the first contact layer 36.

In this embodiment, as the p-type dopant for the first contact layer 36, zinc (Zn) is used instead of magnesium (Mg). Zinc (Zn) is an element higher in diffusion coefficient than magnesium (Mg). Due to this, when zinc (Zn) is diffused into the active layer 32 at a thermal step or the like in manufacturing of the semiconductor laser device, the diffused zinc (Zn) causes deteriorations in emission efficiency and reliability. In this embodiment, however, the dopant zinc (Zn) does not reach the active layer 32 since the first p-type cladding layer 33, the etching stop layer 34, and the second p-type cladding layer 35 whose total thickness is 1 µm or more are formed between the active layer 32 and the first contact layer 36.

Further, in a region below the second contact layer 39 excluding the second p-type cladding layer 35 having the ridge shape, the n-type first current block layer 37 and the n-type second current block layer 38 are provided. It is known that the n-type semiconductor layers exhibit great Zn diffusion stop effect. Thus, it is ensured to stop zinc (Zn) in the n-type semiconductor layers 37 and 38, so that the zinc (Zn) does not reach the active layer 32.

As described so far, according to the semiconductor laser device in the second embodiment, magnesium (Mg) is not used as the dopant for the p-type semiconductor layer (the first contact layer 36) that is grown just before the n-type semiconductor layer (the first current block layer 37) when subjecting the III-V group semiconductor layers containing phosphorus (P) in the V group element to crystal growth. By doing so, the memory effect produced in the n-type semiconductor layer is prevented, and the p-type doping having an excellent controllability can be performed.

Furthermore, since magnesium (Mg) having the low diffusion coefficient can be used as the p-type dopant, entry of the dopant into the active layer 32 is suppressed. Therefore, a semiconductor light emitting device having a high reliability can be realized.

A method for manufacturing the semiconductor laser device thus constituted in the second embodiment will next be described with reference to the drawings.

FIGS. 7A to 7D are sectional block diagrams which show the method for manufacturing the semiconductor laser device in the second embodiment of the present invention in an order of steps.

Figure 7A:
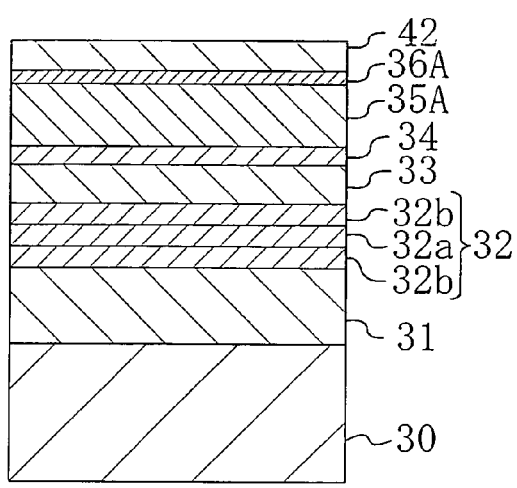
FIGS. 7A to 7D are sectional block diagrams which show a method for manufacturing the semiconductor laser device in the second embodiment of the present invention in an order of steps.

As shown in FIG. 7A, the n-type cladding layer 31 consisting of n-type $Al_{0.35}Ga_{0.15}In_{0.5}P$, the active layer 32 having the multiple quantum well structure, the first p-type cladding layer 33 consisting of p-type $Al_{0.35}Ga_{0.15}In_{0.5}P$, the etching stop layer 34 consisting of p-type $Ga_{0.5}In_{0.5}P$, a second p-type cladding layer formation layer 35A consisting of p-type $Al_{0.35}Ga_{0.15}In_{0.5}P$, a first contact layer formation layer 36A consisting of p-type $Ga_{0.5}In_{0.5}P$, and a cap layer 42 consisting of GaAs are grown on the n-type substrate 30 consisting of GaAs in this order by, for example, the MOCVD method. The cap layer 42 is formed to prevent a surface of the first contact layer formation layer 36A from being oxidized before a next photolithographic step is executed.

FIG. 7A shows a detailed configuration of the active layer 32. In FIG. 7A, reference symbol 32a denotes the multiple quantum well layer constituted so that a well layer consisting of $Ga_{0.5}In_{0.5}P$ and a barrier layer consisting of $Al_{0.25}Ga_{0.25}In_{0.5}P$ are alternately provided. Reference symbol 32b denotes the optical guide layer consisting of $Al_{0.25}Ga_{0.25}In_{0.5}P$. The two optical guide layers 32b vertically put the multiple quantum well layer 32a therebetween.

Growth conditions for forming the respective semiconductor layers by the MOCVD method are as follows. Triethyl gallium (TEG) is used as a gallium source, trimethyl aluminum (TMA) is used as an aluminum source, and trimethyl indium (TMI) is used as an indium source, as III group compound material gases. In addition, phosphine ($PH_3$) and arsine ($AsH_3$) are used as V group compound material gases. The material gases containing the III group compound and the V group compound are introduced into a reaction tube consisting of quartz while using hydrogen as a carrier gas. An internal pressure of the reaction tube is about $1.0 \times 10^4$ Pa (about 76 Torr), and a temperature of the substrate 20 is about 750° C. By appropriately changing a sort and a supply amount of the material gas, the respective semiconductor layers are sequentially formed by crystal growth.

As a material gas for magnesium (Mg) that serves as the p-type dopant while the respective semiconductor layers are formed by crystal growth, bis-cyclo-pentadienil magnesium $(C_5H_5)_2Mg$, for example, is used. In addition, dimethylzinc $(Zn(CH_3)_2)$, for example, is used as a material gas for zinc (Zn).

Figure 7B:
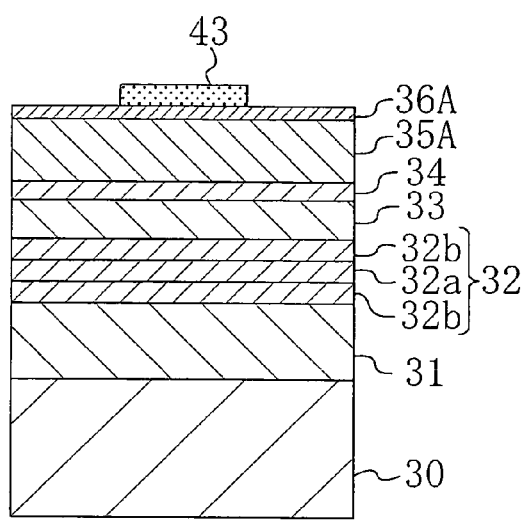

As shown in FIG. 7B, the cap layer 42 is etched away by wet etching using a solution mixture of sulfuric acid and hydrogen peroxide water, thereby exposing the first contact layer formation layer 36A. Thereafter, a silicon oxide film for forming a mask pattern is formed on the first contact layer formation layer 36A by the CVD method, and the formed silicon oxide film is patterned by photolithography and dry etching, thereby forming a stripe mask pattern 43.

Figure 7C:
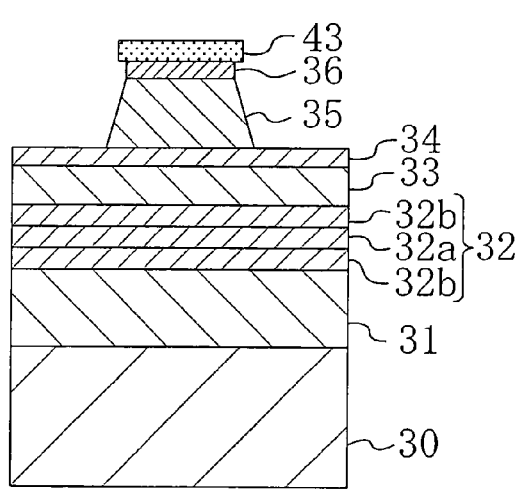
Figure 7D:
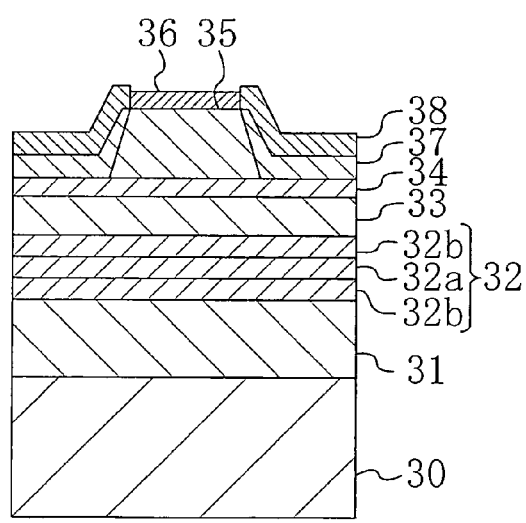

As shown in FIG. 7C, the first contact layer formation layer 36A and the second p-type cladding layer formation layer 35A are sequentially and selectively removed by etching using the mask pattern 43. As a result, the ridge-shaped second p-type cladding layer 35 is formed from the second p-type cladding layer formation layer 35A, and the first contact layer 36 that covers an upper surface of the second p-type cladding layer 35 is formed from the first contact layer formation layer 36A. For etching to the first contact layer 36, an etchant that mainly contains, for example, hydrochloric acid may be used. For selective etching to the second p-type cladding layer 35, an etchant that mainly contains, for example, sulfuric acid may be used as an etchant having a high etching selectivity of AlGaInP to GaInP. By using these etchants, the etching stop layer 34 below the first contact layer 36 and the second p-type cladding layer 35 is hardly etched, so that it is possible to ensure forming the second p-type cladding layer 35 into the ridge shape.

While the mask pattern 43 is left, the first current block layer 37 consisting of n-type $Al_{0.5}In_{0.5}P$ and the second current block layer 38 consisting of n-type GaAs are grown on the etching stop layer 34 by crystal growth so as to include the side surfaces of the second p-type cladding layer 35 and the first contact layer 36 by the MOCVD method. Thereafter, when upper portions of the first current block layer 37 and the second current block layer 38 relative to the mask pattern 43 are removed simultaneously with the mask pattern 43 by a lift-off method, to expose the first contact layer 36, thereby obtaining a state shown in FIG. 7D.

The second contact layer 39 consisting of p-type GaAs is grown on the first contact layer 36 and the second current block layer 38 by the MOCVD method. Thereafter, a metallic material consisting of an alloy containing Au, Ge, and Ni is evaporated on the surface of the n-type substrate 30 opposite to the surface on which the n-type cladding layer 33 is formed by, for example, an electron beam evaporation method, thereby forming the n-side electrode 40. Likewise, a metallic material consisting of an alloy containing, for example, Cr, Pt and Au is evaporated on the second contact layer 29 by the electron beam evaporation method, thereby forming the p-side electrode 41. Thus, the semiconductor laser device shown in FIG. 6 is completed.

As can be seen, the method for manufacturing the semiconductor layer in the second embodiment is characterized in that the first p-type cladding layer 33, the p-type etching stop layer 34, and the second p-type cladding layer 35 are grown by crystal growth while adding magnesium (Mg) thereto, and in that the first contact layer 36 following the second p-type cladding layer 35 is grown by crystal growth without adding magnesium (Mg) thereto.

Modification of Embodiment 2

A semiconductor laser device in a modification of the second embodiment of the present invention will be described.

The semiconductor laser device in the modification differs from the semiconductor laser device in the second embodiment shown in FIG. 6 in that the p-type dopant added to the second p-type cladding layer 35 is zinc (Zn) instead of magnesium (Mg).

Namely, in this modification, no magnesium (Mg) is added to the second p-type cladding layer 35 and the first contact layer 36. In this case, the total thickness of the second p-type cladding layer 35 and the first contact layer 36 is equal to or larger than 1 μm. Therefore, it is possible to ensure preventing the Mg-producing memory effect during the growth of the respective semiconductor layers following the n-type first current block layer 37.

Furthermore, in this modification, zinc (Zn) is added to the second p-type cladding layer 35, the first contact layer 36, and the second contact layer 39 so that each of these layers 35, 36, and 39 has the p conductive type. A distance from the second p-type cladding layer 35 to the active layer 32 is as small as about 0.2 μm, as compared with the second embodiment. It, however, suffices that this distance is about 0.1 μm to ensure a sufficient thickness to prevent Zn diffusion. In addition, the etching stop layer 34 located below the second p-type cladding layer 35 prevent the Zn diffusion more effectively. This Zn diffusion prevention effect is produced by a difference between the composition of each of the second p-type cladding layer 35 and the first p-type cladding layer 33 that is AlGaInP and the composition of the etching stop layer 34 that is GaInP.

Moreover, in this modification, no magnesium (Mg) is added to the second p-type cladding layer 35 and the first contact layer 36. However, the present invention is not limited to this. Magnesium (Mg) may be added to an arbitrary active layer 32-side p-type region among p-type regions of the first p-type cladding layer 33, the etching stop layer 34, the second p-type cladding layer 35, and the first contact layer 36, and no magnesium (Mg) may be added to remaining p-type regions.

In the second embodiment and the modification of the second embodiment, the composition of indium (In) is set at 0.5 in the respective semiconductor layers 31 to 37 each consisting of AlGaInP, GaInP, or AlInP so as to make each layer lattice-matching to the n-type substrate 30. The In composition may be within a range of equal to or larger than 0.45 and equal to or smaller than 0.55. If so setting, the respective semiconductor layers 31 to 37 each consisting of AlGaInP, GaInP, or AlInP can be formed to lattice-match gallium arsenide (GaAs) that constitutes the n-type substrate 30.

Further, in the second embodiment and the modification of the second embodiment, $Al_{0.5}In_{0.5}P$ is used as the semiconductor material for the first current block layer 37. If GaAs is used instead of AlInP, a semiconductor laser device having a complex index semiconductor laser device waveguide structure can be obtained.

Moreover, the configuration of the active layer 32 is not limited to that including the multiple quantum well layer 32a but the active layer 32 may have a single quantum well structure or a single bulk structure composed by one well layer consisting of GaInP.

EMBODIMENT 3

A third embodiment of the present invention will be described with reference to the drawings.

Figure 8:
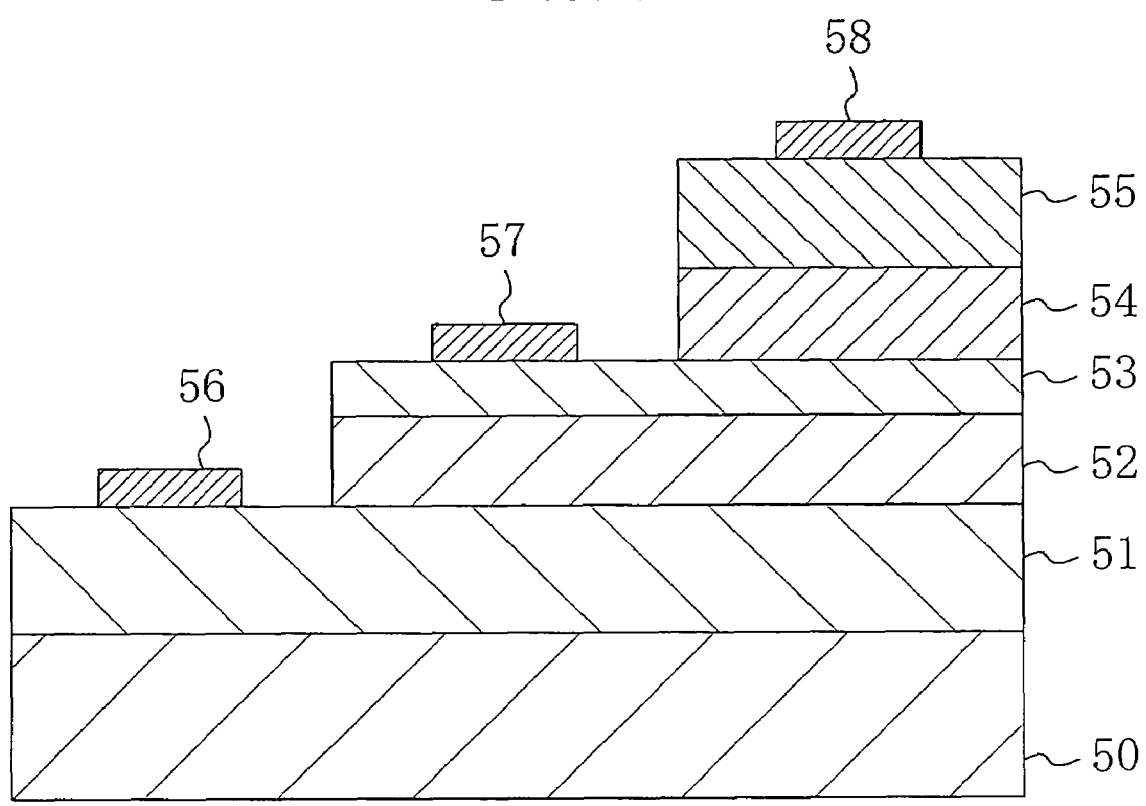
FIG. 8 is a sectional block diagram of a semiconductor device (HBT) in a third embodiment of the present invention.
Figure 9:
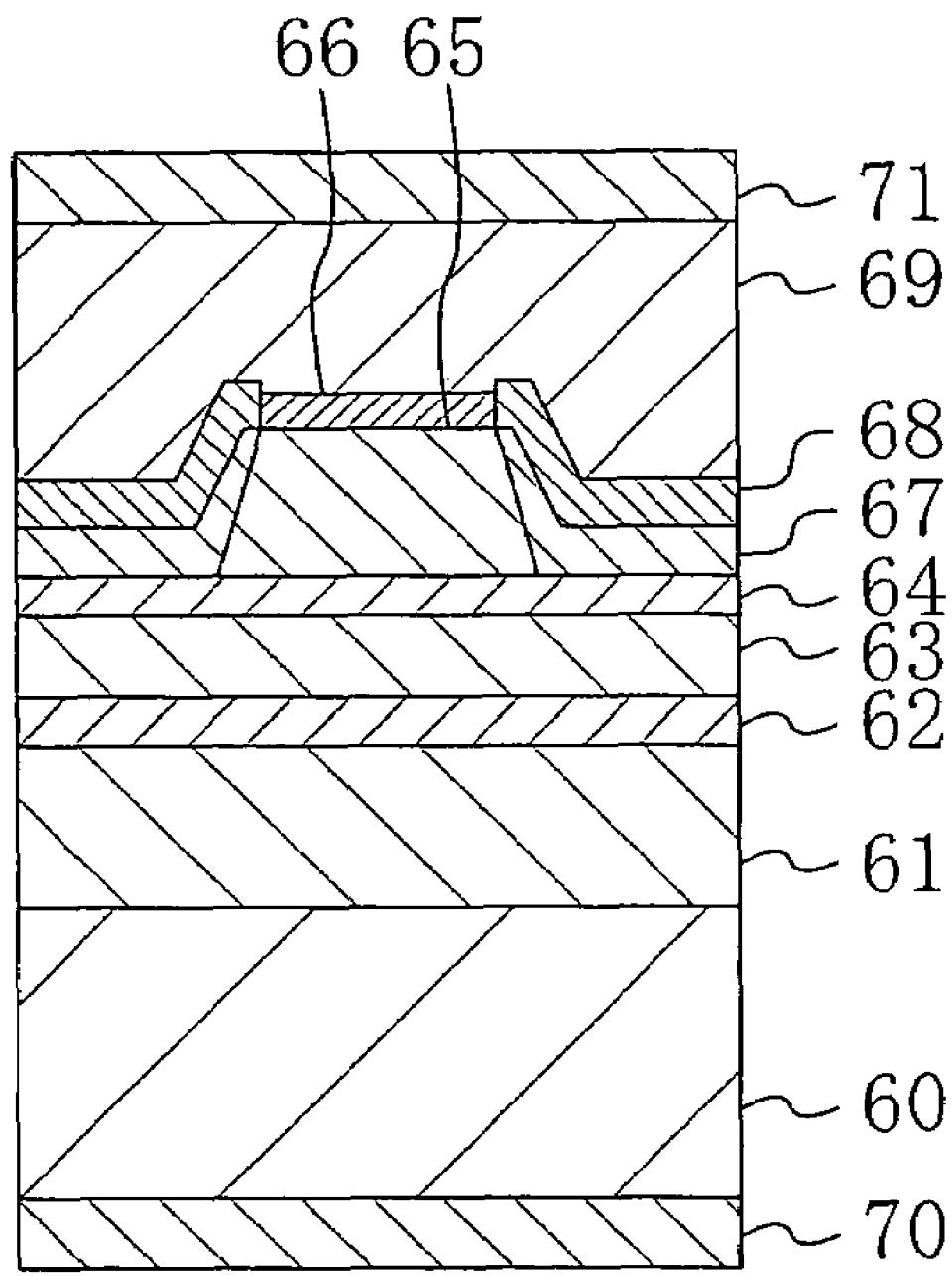
FIG. 9 is a sectional block diagram of a conventional semiconductor laser device.

FIG. 8 is a sectional block diagram of a semiconductor device, i.e., a heterojunction bipolar transistor (HBT) in the third embodiment of the present invention. As shown in FIG. 8, a collector contact layer 51 consisting of n-type GaAs, a collector layer 52 consisting of n-type GaInP, a base layer 53 consisting of p-type GaInP, an emitter layer 54 consisting of n-type AlGaAs, and an emitter contact layer 55 consisting of n-type GaAs are formed on a substrate 50 consisting of, for example, undoped GaAs in this order.

The collector layer 52, the base layer 53, the emitter layer 54, and the emitter contact layer 55 are formed to have stepped cross sections so as to expose part of upper surfaces of the collector contact layer 51 and the base layer 53.

A collector electrode 56 consisting of gold (Au), germanium (Ge), and nickel (Ni) is formed on an exposed surface of the collector contact layer 51. A base electrode 57 consisting of titanium (Ti), platinum (Pt), and gold (Au) is formed on an exposed surface of the base layer 53. An emitter electrode 58 consisting of gold (Au), germanium (Ge), and nickel (Ni) is formed on the emitter contact layer 55.

Silicon (Si) is added, as an n-type dopant, to the collector contact layer 51, the collector layer 52, the emitter layer 54, and the emitter contact layer 55, and magnesium (Mg) is added to the base layer 53 as a p-type dopant.

Table 2 shows specific thicknesses, compositions, dopant types, and doping concentrations for the respective semiconductor layers of the semiconductor device in the third embodiment.

TABLE 2

| Semiconductor layer | Thickness | Compound composition | Dopant | Doping concentration ($cm^{-3}$) |
|---|---|---|---|---|
| Emitter contact layer (55) | 200 nm | GaAs | Si | n type 1 × $10^{19}$ |
| Emitter layer (54) | 100 nm | $Al_{0.9}Ga_{0.1}As$ | Si | n type 5 × $10^{17}$ |
| Base layer (53) | 50 nm | $Ga_{0.5}In_{0.5}P$ | Mg | p type 1 × $10^{18}$ |
| Collector layer (52) | 100 nm | $Ga_{0.5}In_{0.5}P$ | Si | n type 5 × $10^{17}$ |
| Collector contact layer (51) | 200 nm | GaAs | Si | n type 5 × $10^{18}$ |
| Substrate (50) | 100 μm | GaAs | — | — |

As shown in the Table 2, magnesium (Mg) that is the p-type dopant is added only to the base layer 53. Since the base layer 53 consists of the III-V group compound semiconductor containing phosphorus (P), the Mg-producing memory effect can be prevented. Namely, since an Mg concentration of the emitter layer 54 is sufficiently reduced, a concentration of n-type carriers (electrons) of the emitter layer 54 can be adjusted with high controllability. A current characteristic of the HBT can be thereby improved.

In the third embodiment, the HBT has been described as an example of the semiconductor device. However, the semiconductor device is not limited to the HBT. That is, the semiconductor device may be constituted to include a first compound semiconductor layer to which magnesium is added as the dopant and which contains phosphorus in its composition, and a second compound semiconductor layer which is formed on the first compound semiconductor layer and to which magnesium is not added as the dopant, or constituted to include the first compound semiconductor layer to which magnesium is added as the dopant, and the second compound semiconductor layer which is formed on the first compound semiconductor layer and which contains phosphorus in its composition.

As stated so far, the compound semiconductor, the semiconductor device, the method for manufacturing the compound semiconductor, the method for manufacturing the semiconductor device according to the present invention can advantageously prevent the memory effect from being produced when magnesium (Mg) is used as the p-type dopant. Therefore, they are particularly useful as a compound semiconductor having a p conductive type and constituted using the AlGaInP-based semiconductor material, a semiconductor device such as the semiconductor laser device using the compound semiconductor, the method for manufacturing the compound semiconductor, the method for manufacturing the semiconductor device.

What is claimed is:

1. A method for manufacturing a compound semiconductor, comprising:
    a step (a) of forming a first compound semiconductor layer while adding magnesium to the first compound semiconductor layer; and
    a step (b) of forming a second compound semiconductor layer containing phosphorus directly on said first compound semiconductor layer without adding the magnesium to the second compound semiconductor layer.

2. The method for manufacturing a compound semiconductor of claim 1,
    wherein said first compound semiconductor layer contains phosphorus.

3. The method for manufacturing a compound semiconductor of claim 1, further comprising, after said step (b), a step (c) of forming a third compound semiconductor layer containing arsenic or nitrogen directly on said second compound semiconductor layer.

4. The method for manufacturing a compound semiconductor of claim 1,
    wherein said first compound semiconductor layer contains arsenic or nitrogen, and
    the method further comprises, after said step (b), a step (c) of removing said second compound semiconductor layer.

5. The method for manufacturing a compound semiconductor of claim 1,
    wherein at said step (b), said second compound semiconductor layer is formed while adding zinc to the second compound semiconductor layer.

6. The method for manufacturing a compound semiconductor of claim 1,
    wherein a thickness of said second compound semiconductor layer is equal to or larger than 0.1 μm.

7. The method for manufacturing a compound semiconductor of claim 4,
    wherein said first compound semiconductor layer does not contain phosphorous.

8. A method for manufacturing a semiconductor device, composing:
    a step (a) of forming an n-type cladding layer serving as a first compound semiconductor layer on a substrate;
    a step (b) of forming an active layer serving as a second compound semiconductor layer on said n-type cladding layer;
    a step (c) of forming a third compound semiconductor layer directly on said active layer while adding magnesium to the third compound semiconductor layer;
    a step (e) of forming a fifth compound semiconductor layer directly on said third compound semiconductor layer while adding the magnesium to the fifth compound semiconductor layer; and
    a step (d) of forming a fourth compound semiconductor layer containing phosphorus directly on said fifth compound semiconductor layer without adding the magnesium to the fourth compound semiconductor layer.

9. The method for manufacturing a semiconductor device of claim 8,
    wherein at said step (d), said fourth compound semiconductor layer is formed while adding zinc to the fourth compound semiconductor layer.

10. The method for manufacturing a semiconductor device of claim 9,
    wherein each of said third compound semiconductor layer and said fourth compound semiconductor layer consists of AlGaInP, and
    said fifth compound semiconductor layer consists of GaInP.

11. The method for manufacturing a semiconductor device of claim 10,
    wherein a thickness of said fifth compound semiconductor layer is equal to or smaller than 15 nm, and
    the method further comprises, after said step (d), a step (f) of forming said fourth compound semiconductor layer into a ridge shape.

12. The method for manufacturing a semiconductor device of claim 8,
    wherein a thickness of said fourth compound semiconductor layer is equal to or larger than 0.1 μm.

13. A method for manufacturing a semiconductor device, comprising:
    a step (a) of forming an n-type cladding layer serving as a first compound semiconductor layer on a substrate;
    a step (b) of forming an active layer serving as a second compound semiconductor layer directly on said n-type cladding layer;
    a step (c) of forming a third compound semiconductor layer directly on said active layer while adding magnesium to the third compound semiconductor layer;
    a step (e) of forming a fifth compound semiconductor layer directly on said third compound layer while adding magnesium to the fifth compound semiconductor layer;
    a step (d) of forming a fourth compound semiconductor layer directly on said fifth compound semiconductor layer while adding the magnesium to the fourth compound semiconductor layer; and
    a step (g) of forming a sixth compound semiconductor layer containing phosphorous directly on said fourth compound semiconductor layer without adding the magnesium to the sixth compound semiconductor layer, wherein at said step (g), said sixth compound semiconductor layer is formed while adding zinc to the sixth compound layer.

14. The method for manufacturing a semiconductor device of claim 13,
wherein each of said third compound semiconductor layer and said fourth compound semiconductor layer consists of AlGaInP, and said fifth compound semiconductor layer consists of GaInP.

15. The method for manufacturing a semiconductor device of claim 14,
wherein a thickness of said fifth compound semiconductor layer is equal to or smaller than 15 μm,
the method further comprises, after said step (g), a step (h) of forming both said fourth compound semiconductor layer and said sixth compound semiconductor layer into a ridge shape, and
a thickness of said fourth compound semiconductor layer is equal to or larger than 1 μm.

* * * * *